United States Patent
Jung

(10) Patent No.: US 7,771,920 B2
(45) Date of Patent: *Aug. 10, 2010

(54) ANTI-REFLECTIVE POLYMER, ANTI-REFLECTIVE COMPOSITION CONTAINING THE SAME, AND METHOD FOR FORMING PATTERN USING THE SAME

(75) Inventor: Jae Chang Jung, Seoul (KR)

(73) Assignee: Hynix Semiconductor Inc., Seoul (KR)

( * ) Notice: Subject to any disclaimer, the term of this patent is extended or adjusted under 35 U.S.C. 154(b) by 140 days.

This patent is subject to a terminal disclaimer.

(21) Appl. No.: 12/133,511

(22) Filed: Jun. 5, 2008

(65) Prior Publication Data

US 2009/0042140 A1    Feb. 12, 2009

(30) Foreign Application Priority Data

Aug. 9, 2007    (KR) .................... 10-2007-0079944

(51) Int. Cl.
  *G03F 7/11*    (2006.01)
  *G03F 7/38*    (2006.01)
  *C08F 16/38*    (2006.01)
  *C08F 16/30*    (2006.01)

(52) U.S. Cl. .................. 430/325; 430/330; 430/326; 430/311; 430/271.1; 525/328.5; 525/328.7

(58) Field of Classification Search .............. None
See application file for complete search history.

(56) References Cited

U.S. PATENT DOCUMENTS

| | | | | | |
|---|---|---|---|---|---|
| 3,350,367 | A | * | 10/1967 | Wakasa et al. | 528/378 |
| 4,861,705 | A | * | 8/1989 | Margel | 435/2 |
| 5,593,725 | A | | 1/1997 | Park et al. | |
| 5,674,648 | A | * | 10/1997 | Brewer et al. | 430/18 |
| 6,319,835 | B1 | * | 11/2001 | Sahbari et al. | 438/689 |
| 6,458,908 | B1 | * | 10/2002 | Imai et al. | 526/259 |
| 6,489,432 | B2 | * | 12/2002 | Jung et al. | 528/230 |
| 6,696,540 | B2 | * | 2/2004 | Okubo et al. | 528/76 |
| 6,770,720 | B2 | * | 8/2004 | Jung et al. | 526/315 |
| 2004/0014935 | A1 | * | 1/2004 | Choi et al. | 528/374 |
| 2005/0277755 | A1 | * | 12/2005 | Hamada et al. | 528/32 |

OTHER PUBLICATIONS

Jae-Chang Jeong, et al, machine generated English translation from KIPO of KR 10-2001-0018906 A, published Mar. 15, 2001, translation generated Jun. 10, 2010, 34 pages.*

Gwan-Gu Lee, machine generated English translation from KIPO of KR 10-2005-0015268, published Feb. 21, 2005, translation generated Jun. 10, 2010, 17 pages.*

* cited by examiner

Primary Examiner—Cynthia Hamilton
(74) Attorney, Agent, or Firm—Marshall, Gerstein & Borun LLP

(57) ABSTRACT

A polymer for crosslinking an anti-reflective film has a high refractive index. An anti-reflective composition containing the polymer for crosslinking is useful in an immersion lithography process using ArF (193 nm) of a semiconductor device manufacturing process.

10 Claims, 3 Drawing Sheets

ANTI-REFLECTIVE POLYMER, ANTI-REFLECTIVE COMPOSITION CONTAINING THE SAME, AND METHOD FOR FORMING PATTERN USING THE SAME

CROSS-REFERENCE TO RELATED APPLICATION

The priority of Korean patent application number 10-2007-0079944, filed on Aug. 9, 2007, the disclosure of which is incorporated by reference in its entirety, is claimed.

BACKGROUND OF THE INVENTION

The invention relates to a polymer for crosslinking an anti-reflective film that has a high refractive index and an anti-reflective composition containing the same that is particularly useful in an immersion lithography process using ArF (193 nm) of a semiconductor device manufacturing process.

In a process for forming ultra fine patterns, standing waves and reflective notching resulting from changes in optical properties and resist thicknesses of bottom films of photoresist films, and fluctuation of critical dimensions due to diffracted light and reflected light from the bottom films unavoidably occur. As a result, materials for absorbing light in wavelength range of the light used as an exposure light source have been used. Thus, an anti-reflective film for preventing reflection in bottom films may be deposited in a bottom portion of photoresist films, which can be used in a fine process.

From a light source, ultraviolet rays penetrate a photoresist film, so that a light incident on the bottom layer of the photoresist film is scattered or reflected. An organic anti-reflective film absorbs the scattered or reflected light, which affects the photolithography process.

A dry lithography process uses air having a re-fractive index of 1.0 as a medium for transmission of an exposure beam between an exposure lens and a wafer including a photoresist film. Unlike the dry lithography process, an immersion lithography process uses a liquid such as $H_2O$ or an organic solvent having a refractive index of 1.0 or more as a medium. As a result, even when a light source of the same wavelength is used, the immersion lithography process has the same effect as when a light source having a short wave or a lens having a high numerical aperture (NA) is used. Also, the depth of focus is not degraded.

Therefore, the immersion lithography process can improve the depth of focus, and form an ultra fine pattern using a conventional exposure wavelength.

However, when an anti-reflective composition having a low refractive index is used in the immersion lithography process, the reflectance of the exposure light source may increase, and the photoresist pattern may collapse. As a result, it is necessary to develop an anti-reflective material having a high refractive index useful for the immersion lithography process.

BRIEF SUMMARY OF THE INVENTION

Various embodiments of the invention are directed at providing a polymer for crosslinking an anti-reflective film useful for an immersion lithography process, an anti-reflective composition containing the same, and a method for forming a photoresist pattern using the same.

According to an embodiment of the invention, a polymer for crosslinking comprises a repeating unit of Formula 1:

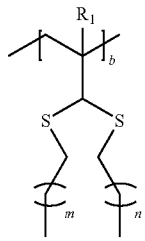

[Formula 1]

wherein $R_1$ is hydrogen or methyl, b is a number of the repeating unit, which is a natural number, and m and n are each an integer ranging from 0 to 4.

The repeating unit of Formula 1 is preferably represented by Formula 1a:

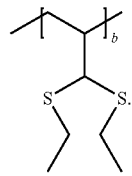

[Formula 1a]

The repeating unit of Formula 1 preferably has an average molecular weight ranging from 1,000 to 100,000.

According to one embodiment of the invention, an anti-reflective composition comprises a mixture of the above polymer, a base resin capable of absorbing light, a thermal acid generator, and an organic solvent.

Any suitable resins which can absorb a light source can be used in the composition as the base resin. In case of ArF, the base resin capable of absorbing light preferably comprises polyvinylphenol.

Any suitable compound that can generate an acid by the application of heat can be used in the composition as the thermal acid generator. The thermal acid generator preferably comprises 2-hydroxycyclohexyl p-toluensulfonate.

Any suitable organic solvent can be used. For example, the organic solvent preferably comprises methyl 3-methoxypropionate (MMP), ethyl 3-ethoxypropionate (EEP), propyleneglycol methyletheracetate (PGMEA), cyclohexanone, or a combination thereof.

The base resin is preferably present in an amount ranging from 30 to 1,000 parts by weight, the thermal acid generator is preferably present in an amount ranging from 2 to 20 parts by weight, and the organic solvent is preferably present in an amount ranging from 2,000 to 10,000 parts by weight, based on 100 parts by weight of the polymer for crosslinking of the invention.

The anti-reflective composition is particularly useful for an immersion lithography process.

According to another embodiment of the invention, a method for forming a pattern of a semiconductor device comprises: coating the anti-reflective composition of the invention over an underlying layer; performing a baking process to bake the anti-reflective composition coating to form an anti-reflective film; and forming a photoresist pattern over the anti-reflective film.

The baking process is preferably performed at 150–300° C. for 30 seconds to 2 minutes. The exposure process is preferably an ArF immersion lithography process.

According to a further embodiment of the invention, a semiconductor device may be manufactured by a method comprising the inventive method for forming a pattern of a semiconductor device.

In order to increase resolution of the pattern, the anti-reflective film should have a high refractive index as the numerical aperture (NA) of an exposure apparatus is increased. Particularly, in the immersion lithography process, a liquid such as $H_2O$ or an organic solvent that have a refractive index greater than 1.0 are used as a medium, thereby obtaining the same effect as when a light source having a short wavelength or a lens having high NA is used, even when a light source having the same exposure wavelength is used. An anti-reflective film having a high refractive index is preferably used in the immersion lithography process to decrease reflectance, and it is possible to obtain a vertical pattern without standing waves, and the pattern does not collapse.

The anti-reflective film of the invention includes a sulfur atom in the polymer for crosslinking, thereby obtaining an anti-reflective film having a high refractive index. As a result, the anti-reflective film is particularly useful for an immersion lithography process.

DESCRIPTION OF EMBODIMENTS

The invention is described in detail with reference to the following Examples, which are illustrative rather than limiting.

Example 1

Preparation of Polymer for Crosslinking

Figure 1A:
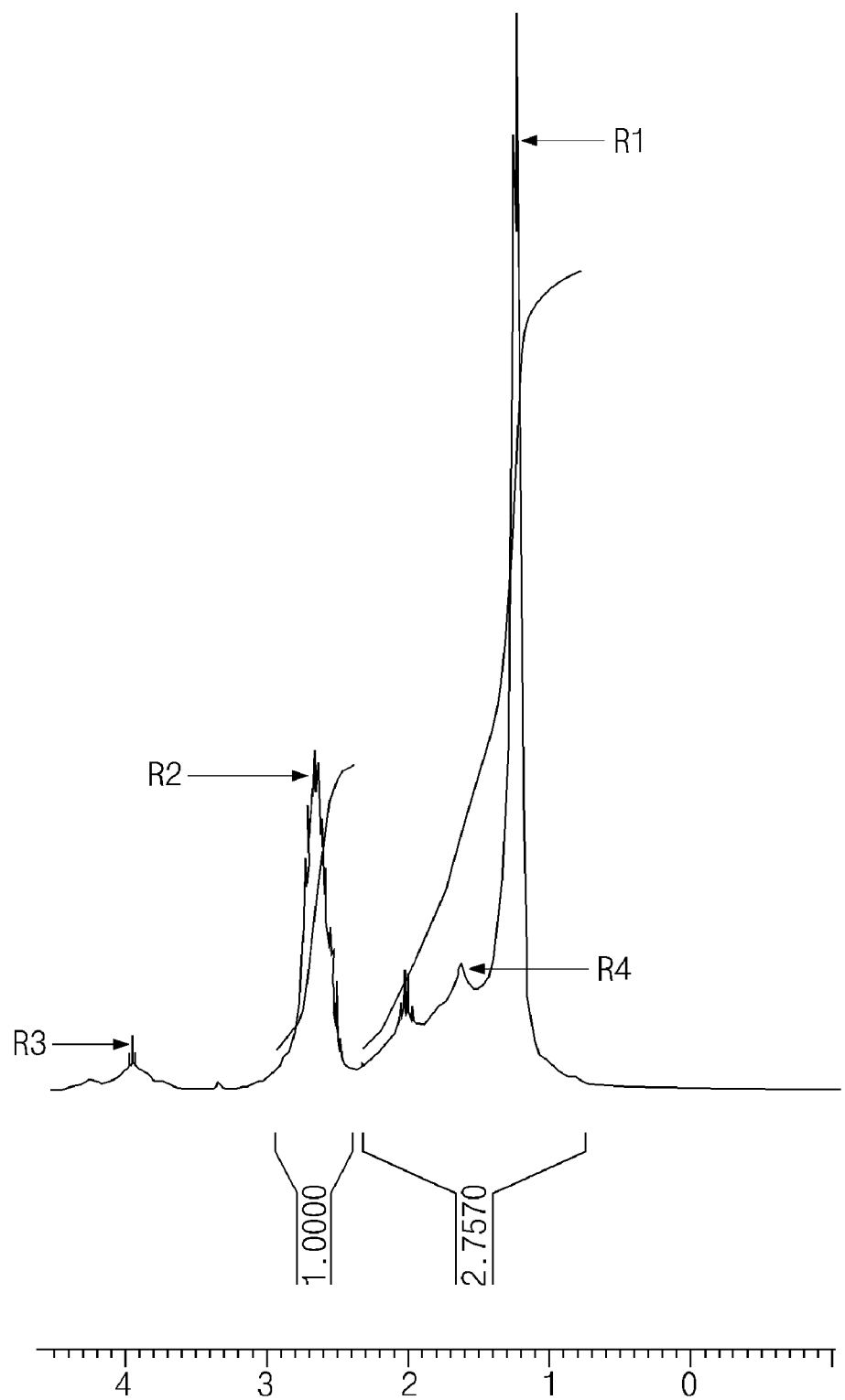
FIG. 1 is a NMR spectrum of a polymer of Example 1.
Figure 1B:
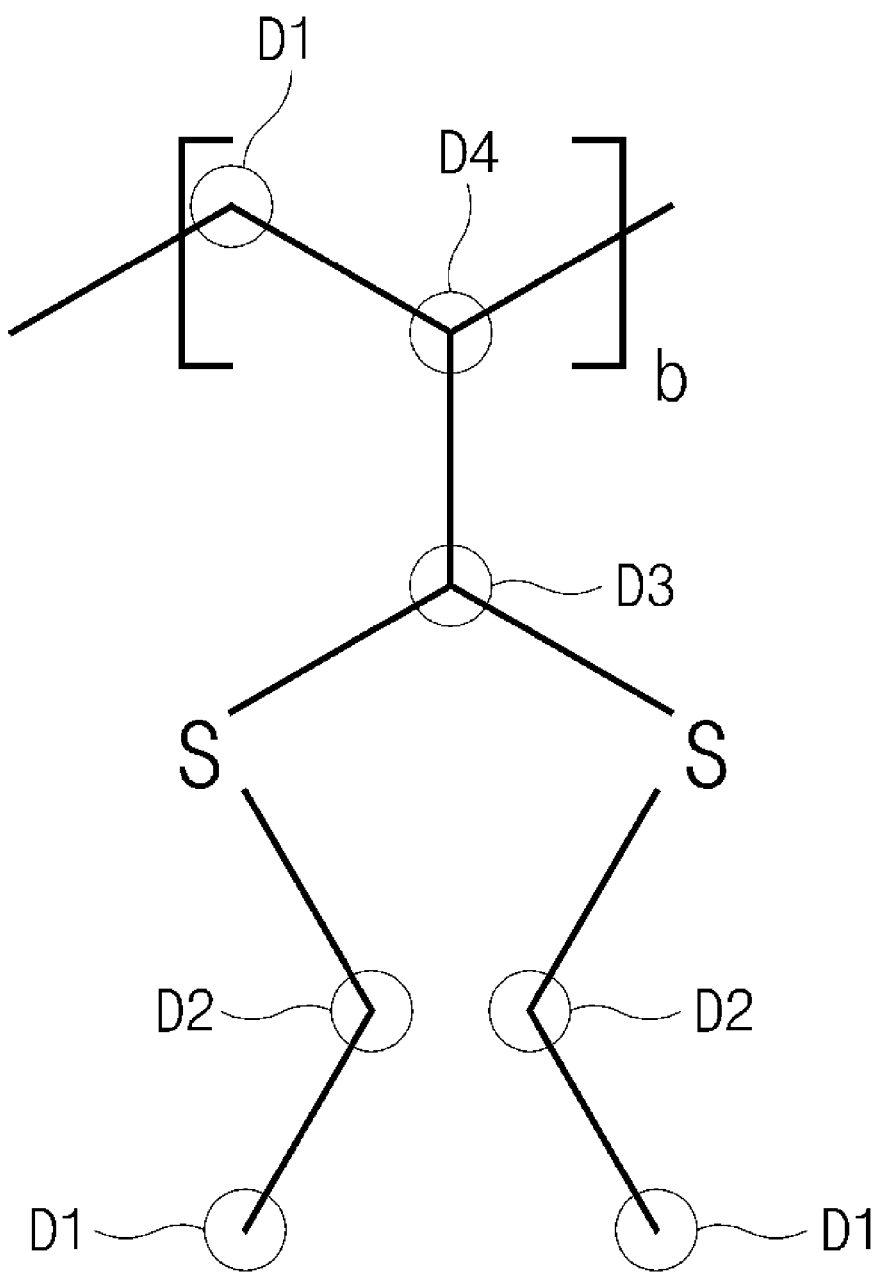

Acrolein (100 g), AIBN (3 g), and PGMEA (400 g) were reacted at 80° C. for about 8 hours in a round bottom flask. After reaction, the resulting mixture was precipitated in n-hexane (4 l) to obtain white powder. To the white powder, ethanethiol (500 g) and p-toluenesulfonic acid (0.5 g) were added and reacted at 32° C. for about 24 hours. After reaction, triethylamine (1 g) was added and stirred for about 30 minutes. After stirring, the resulting mixture was precipitated in n-hexane to obtain a poly(3,3,-dithioethylpropene) polymer (40 g) (see FIG. 1A and FIG. 1B). In FIG. 1A and FIG. 1B, Region 1 (R1) to Region 4 (R4) are separately due to D1 to D4.

Example 2

Preparation of Anti-Reflective Composition

To PGMEA (500 g), the polymer (7 g) obtained from Example 1, polyvinylphenol resin (3 g) having a molecular weight of 8000, and 2-hydroxycyclohexyl p-toluenesulfonate (0.03 g) were added, and filtered through a 100 nm filter to obtain an anti-reflective composition.

Example 3

Measurement of Refractive Index and Absorption Coefficient

The anti-reflective composition obtained from Example 2 was coated with 28 nm thickness over a silicon wafer, and baked at 220° C. for 60 seconds to form an anti-reflective film. Then, a refractive index (n) and an absorption coefficient (k) at 193 nm were measured with an ellipsometer. As a result, n=1.86 and k=0.28.

Example 4

Formation of Pattern

Figure 2:
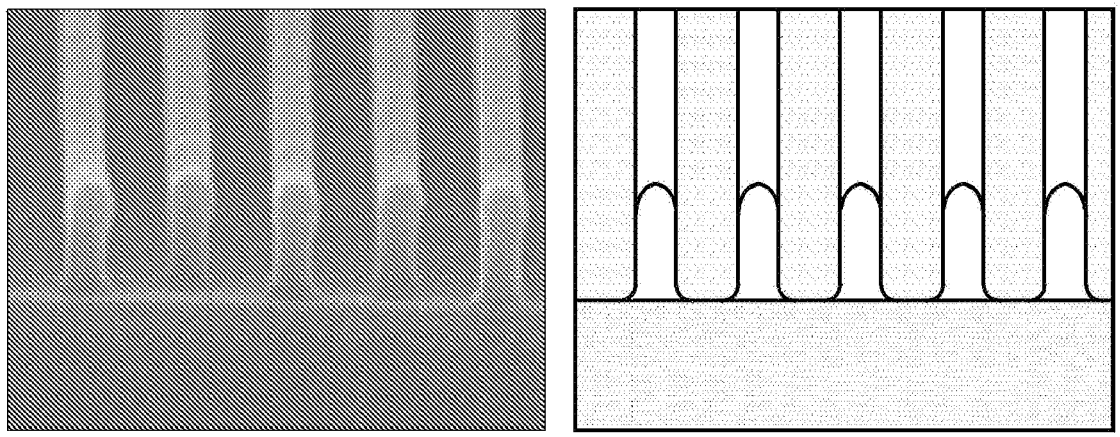
FIG. 2 is a SEM photography (left) and its drawn illustration (right) of a pattern of Example 4.

An amorphous carbon film with a thickness of 2000 Å, and a SiON film with a thickness of 400 Å were sequentially coated over a silicon wafer. The anti-reflective composition obtained from Example 2 was spin-coated over the SiON film, and baked at 220° C. for 60 seconds to obtain an anti-reflective film having a thickness of 250 Å. After baking, a photoresist material for immersion lithography (AIM5076 manufactured by Japan Synthesis Rubber Co., Ltd.) was spin-coated, and baked at 110° C. for 60 seconds. The resulting structure was exposed by an immersion exposure apparatus (1700i manufactured by ASML Co., Ltd.), and post-baked at 105° C. for 60 seconds. After post-baking, the resulting structure was developed with a 2.38 wt % TMAH (tetramethylammonium hydroxide) developing solution to obtain a vertical pattern without standing waves (see FIG. 2).

As described above, an anti-reflective film according to an embodiment of the invention includes a sulfur atom in a polymer for crosslinking, so that an anti-reflective film having a high refractive index can be formed. Also, the anti-reflective film can be useful for an immersion lithography process. In the immersion lithography process, the anti-reflective film having a high refractive index reduces a reflectance to facilitate obtaining a vertical pattern without standing waves, and prevents collapse of patterns.

The above embodiments of the invention are illustrative and not limiting. Various alternatives and equivalents are possible. The invention is not limited by the type of deposition, etching polishing, and patterning steps described herein, nor is the invention limited to any specific type of semiconductor device. For example, the invention may be implemented in a dynamic random access memory DRAM device or in a non-volatile memory device. Other additions, subtractions, or modifications are intended to fall within the scope of the appended claims.

What is claimed is:

1. A polymer comprising a repeating unit of Formula 1:

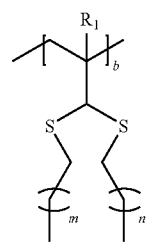

[Formula 1]

wherein $R_1$ is hydrogen or methyl, b is a number of the repeating unit, which is a natural number, and m and n are each an integer ranging from 0 to 4.

2. The polymer according to claim 1, wherein the repeating unit of Formula 1 is represented by Formula 1a:

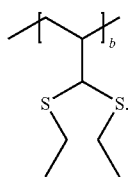

[Formula 1a]

3. The polymer according to claim 1, wherein the repeating unit of Formula 1 has an average molecular weight ranging from 1,000 to 100,000.

4. An anti-reflective composition comprising the polymer of claim 1, a base resin capable of absorbing light, a thermal acid generator, and an organic solvent.

5. The anti-reflective composition according to claim 4, wherein the base resin capable of absorbing light comprises polyvinylphenol.

6. The anti-reflective composition according to claim 4, wherein the thermal acid generator comprises 2-hydroxycyclohexyl paratoluensulfonate.

7. The anti-reflective composition according to claim 4, wherein the organic solvent is selected from the group consisting of methyl 3-methoxypropionate (MMP), ethyl 3-ethoxypropionate (EEP), propyleneglycol methyletheracetate (PGMEA), cyclohexanone, and combinations thereof.

8. The anti-reflective composition according to claim 4, wherein the base resin is present in an amount ranging from 30 to 1,000 parts by weight, the thermal acid generator is present in an amount ranging from 2 to 20 parts by weight and the organic solvent is present in an amount ranging from 2,000 to 10,000 parts by weight, based on 100 parts by weight of the polymer.

9. A method for forming a pattern of a semiconductor device, the method comprising:
coating the anti-reflective composition of claim 4 over an underlying layer;
baking the anti-reflective composition coating to form an anti-reflective film; and
forming a photoresist pattern over the anti-reflective film.

10. The method according to claim 9, comprising forming the photoresist pattern by an ArF immersion lithography process.

\* \* \* \* \*